(12) United States Patent
Ishikawa et al.

(10) Patent No.: US 10,347,521 B2
(45) Date of Patent: Jul. 9, 2019

(54) HEATING MEMBER, ELECTROSTATIC CHUCK, AND CERAMIC HEATER

(71) Applicant: NGK SPARK PLUG CO., LTD., Nagoya-shi, Aichi (JP)

(72) Inventors: Hironobu Ishikawa, Kasugai (JP); Yasuhiko Inui, Kani (JP); Taichi Kibe, Komaki (JP); Jun Kurano, Kiyosu (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 402 days.

(21) Appl. No.: 15/285,596

(22) Filed: Oct. 5, 2016

(65) Prior Publication Data
US 2017/0110357 A1 Apr. 20, 2017

(30) Foreign Application Priority Data

Oct. 16, 2015 (JP) ................................. 2015-204634

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC .... B23Q 3/15; H01J 37/32091; H01L 21/683; H01L 21/31116; H01L 21/31138;
(Continued)

(56) References Cited

U.S. PATENT DOCUMENTS 6,891,263 B2 * 5/2005 Hiramatsu .......... H01L 21/6732
                                                        118/724
6,929,874 B2 * 8/2005 Hiramatsu .............. B32B 18/00
                                                        219/544
(Continued)

FOREIGN PATENT DOCUMENTS

JP          2000-012195 A       1/2000
JP          2000012195 A  *     1/2000
(Continued)

OTHER PUBLICATIONS

Korean Intellectual Property Office, Office Action (Notification of Reason for Refusal) issued in corresponding Application No. 10-2016-0114532, dated Oct. 29, 2018.

*Primary Examiner* — Thienvu V Tran
*Assistant Examiner* — Nicolas Bellido
(74) *Attorney, Agent, or Firm* — Stites & Harbison, PLLC; Jeffrey A. Haeberlin; James R. Hayne

(57) ABSTRACT

A heating member includes a ceramic substrate having a structure in which a plurality of ceramic layers are laminated together; a resistance heat-generating element embedded in the ceramic substrate; an electricity supply element disposed on a surface of the ceramic substrate; and an electricity supply path embedded in the ceramic substrate and electrically connecting the resistance heat-generating element and the electricity supply element. The electricity supply path includes a plurality of conductive layers disposed along the planar direction of the ceramic layers at different positions in the thickness direction of the ceramic substrate, and a plurality of vias disposed along the thickness direction of the ceramic substrate. When the plurality of conductive layers are viewed from the thickness direction, their outer edges are positionally offset from one another.

9 Claims, 5 Drawing Sheets

(58) Field of Classification Search
CPC ......... H01L 21/67103; H01L 21/67109; H01L 21/6831; H01L 21/6833; H01L 21/68742; H01L 21/6875; H01L 21/68785; H01L 2224/83; H02N 13/00; H05B 3/20; H05B 3/68
USPC ........................................................ 361/234
See application file for complete search history.

(56) References Cited

U.S. PATENT DOCUMENTS

| | | | |
|---|---|---|---|
| 2003/0042247 A1* | 3/2003 | Ito | H01L 21/67103 219/465.1 |
| 2006/0221539 A1* | 10/2006 | Morita | H01L 21/67103 361/234 |
| 2008/0224333 A1 | 9/2008 | Fukasawa | |

FOREIGN PATENT DOCUMENTS

| | | | | |
|---|---|---|---|---|
| JP | 2004071647 A | * | 3/2004 | |
| JP | 2014-75525 A | | 4/2014 | |
| JP | 2014075525 A | * | 4/2014 | |
| JP | 2014130908 A | * | 7/2014 | |
| KR | 20080084714 A | | 9/2008 | |

* cited by examiner

HEATING MEMBER, ELECTROSTATIC CHUCK, AND CERAMIC HEATER

CROSS REFERENCE TO RELATED APPLICATION

The present application claims priority to Japanese Patent Application No. 2015-204634, which was filed on Oct. 16, 2015, the disclosure of which is herein incorporated by reference in its entirety.

BACKGROUND OF THE INVENTION

Field of the Invention

The present invention relates to a heating member for heating a workpiece such as a semiconductor wafer and to an electrostatic chuck and a ceramic heater which include the heating member.

Description of Related Art

Conventionally, a semiconductor fabrication apparatus has performed, for example, dry etching (e.g., plasma etching) on a semiconductor wafer (e.g., a silicon wafer). Since, in order to enhance accuracy of dry etching, the semiconductor wafer must be securely fixed, an electrostatic chuck has been proposed as means for fixing the semiconductor wafer. The electrostatic chuck fixes the semiconductor wafer by electrostatic attraction.

Specifically, the electrostatic chuck, for example, has an internal chucking electrode in a ceramic substrate formed of laminated ceramic layers. By use of electrostatic attraction generated through application of voltage to the chucking electrodes, the electrostatic chuck chucks the semiconductor wafer on one surface (a chucking surface) of the ceramic substrate. Usually, a metal base is bonded to the other surface (bonding surface) of the ceramic substrate.

Also, a certain known electrostatic chuck has a function of adjusting the temperature of (heating or cooling) a semiconductor wafer chucked on the chucking surface. For example, according to a known technique, a heat-generating element (e.g., a linear heat-generating pattern) is disposed in the ceramic substrate, and the heat-generating element heats the ceramic substrate to thereby heat the semiconductor wafer on the chucking surface. Also, according to another known technique, a cooling path is provided in the metal base for flowing cooling fluid therethrough to thereby cool the ceramic substrate.

Further, according to a technique disclosed in recent years for making the temperature of the chucking surface (i.e., in-plane temperature) two-dimensionally uniform, a conductive layer in the form of a land pattern and which partially constitutes an electricity supply path for supplying electric power to the heat-generating element is disposed in layers (e.g., two layers) in the ceramic substrate (see Patent Document 1).

According to this technique, for example, two conductive layers are disposed at different positions in the thickness direction and have the same planar shape (i.e., the shape projected in the thickness direction) along the ceramic layers and the same external dimension. Also, vias are formed along the thickness direction for electrically connecting the two conductive layers.

In the case where two conductive layers are provided in the ceramic substrate as mentioned above, the ceramic substrate is manufactured, for example, as follows: ceramic green sheets on which patterns that are to become conductive layers are formed respectively are laminated together, followed by firing.

PRIOR ART DOCUMENT

Patent Document 1 is Japanese Patent Application Laid-Open (kokai) No. 2014-75525.

BRIEF SUMMARY OF THE INVENTION

However, according to the above-mentioned technique in which, for example, two conductive layers are disposed in such a manner as to have the same shape projected in the thickness direction and the same external dimension, since a large step corresponding to the thicknesses of the two conductive layers arises between a region where the two conductive layers are disposed in an overlying manner and its peripheral region, separation has been apt to arise between ceramic layers in the vicinity of the step.

That is, each conductive layer is sandwiched between ceramic layers, and the above-mentioned step has been apt to cause the occurrence of separation between the ceramic layers.

The present invention has been conceived in view of the above problem, and an object of the invention is to provide a heating member, an electrostatic chuck, and a ceramic heater which can restrain the occurrence of separation in a ceramic substrate by means of reducing the magnitude of a step that arises as a result of existence of a plurality of conductive layers in the ceramic substrate.

(1) A heating member of a first mode of the present invention comprises a ceramic substrate having a structure in which a plurality of ceramic layers are laminated together; a resistance heat-generating element embedded in the ceramic substrate; an electricity supply element disposed on a surface of the ceramic substrate; and an electricity supply path embedded in the ceramic substrate and electrically connecting the resistance heat-generating element and the electricity supply element. The electricity supply path comprises a plurality of conductive layers disposed along a planar direction of the ceramic layers at different positions in a thickness direction of the ceramic substrate, and a plurality of vias disposed along the thickness direction of the ceramic substrate. When the plurality of conductive layers are viewed from the thickness direction, outer edges of at least a pair of the conductive layers are positionally offset from each other. In other words, an outer edge of one of the plurality of conductive layers is positionally offset from an outer edge of at least one other of the plurality of conductive layers.

According to the first mode, since, when a plurality of the conductive layers are viewed from the thickness direction, the outer edges of at least a pair of the conductive layers are positionally offset from each other, a large step is unlikely to arise with respect to the thickness direction. Therefore, separation is unlikely to arise between the ceramic layers, etc.

That is, since the outer edges of a pair of the conductive layers are positionally offset from each other, in a region where the outer edges are positionally offset from each other, the conductive layers do not overlie each other. Thus, a step which arises as a result of existence of the conductive layers can be reduced in magnitude. Therefore, there can be restrained the occurrence of separation between the ceramic layers and between the ceramic layer and the conductive layer, which could otherwise be likely to result from formation of a step.

(2) A heating member of a second mode of the present invention is characterized in that, when a pair of the conductive layers whose outer edges are positionally offset from each other is viewed from the thickness direction, a region demarcated by the outer edge of one of the conductive layers encompasses the other conductive layer.

According to the second mode, since a region demarcated by the outer edge of the one conductive layer encompasses the other conductive layer, vias to be electrically connected to the one conductive layer can be readily provided in a wide planar region of the other conductive layer. That is, since the positional limitations of the vias are few, the degree of freedom of design is improved.

(3) A heating member of a third mode of the present invention is characterized in that, when a pair of the conductive layers whose outer edges are positionally offset from each other is viewed from the thickness direction, the conductive layer located toward the resistance heat-generating element is greater in area than the conductive layer located toward the electricity supply element.

According to the third mode, since the conductive layer located toward the resistance heat-generating element is greater in area than the conductive layer located toward the electricity supply element, temperature distribution can be two-dimensionally uniform on the surface of the ceramic substrate located on the side where the resistance heat-generating element is present.

(4) A heating member of a fourth mode of the present invention is characterized in that at least one of the plurality of conductive layers has one or more (i.e., a plurality) through holes extending therethrough in the thickness direction.

According to the fourth mode, since the conductive layer (s) has one or more through holes formed therein, the bonding performance between the ceramic layers between which the conductive layer is sandwiched is enhanced.

(5) A heating member of a fifth mode of the present invention is characterized in that at least two of the plurality of conductive layers have one or more (i.e., a plurality) through holes extending therethrough in the thickness direction and that, when the at least two conductive layers having the through holes formed therein are viewed from the thickness direction, the through holes of one conductive layer (i.e., a first of the two of the plurality of conductive layers) are positionally offset from the through holes of the other conductive layer (i.e., a second of the two of the plurality of conductive layers).

According to the fifth mode, since the through holes of one of the two conductive layers are positionally offset from the through holes of the other conductive layer, as compared with the case where the through holes of one of the two conductive layers are not positionally offset from the through holes of the other conductive layer, the bonding performance between the ceramic layers is enhanced.

(6) An electrostatic chuck of a sixth mode of the present invention comprises the above-mentioned heating member, and a chucking electrode embedded in the ceramic substrate.

The electrostatic chuck of the sixth mode can heat a workpiece by the heating member. Also, the workpiece can be chucked by electrostatic attraction generated by the chucking electrode. The chucking electrode can be provided in the heating member.

(7) A ceramic heater of a seventh mode of the present invention comprises the above-mentioned heating member, and a radio frequency electrode embedded in the ceramic substrate.

The ceramic heater of the seventh mode can heat a workpiece by the heating member. Also, plasma processing can be performed on a workpiece by means of the radio frequency electrode (an RF electrode, or a plasma generation electrode) and a counter electrode. The radio frequency electrode can be provided in the heating member.

Constituent elements of the present invention will next be described.

The ceramic substrate can contain ceramic as a main component.

Since the ceramic substrate has a structure in which a plurality of ceramic layers are laminated together, structural elements such as conductive layers can be readily formed therein. The ceramic substrate used in the heating member, the electrostatic chuck, and the ceramic heater is an electrically insulating ceramic insulation plate.

The ceramic substrate (ceramic layers) is formed of, for example, a sintered body which predominantly contains a high-temperature-fired ceramic such as alumina, yttria (yttrium oxide), aluminum nitride, boron nitride, silicon carbide, or silicon nitride. Alternatively, the ceramic substrate may be formed of a sintered body which predominantly contains a low-temperature-fired ceramic such as a glass ceramic formed by adding an inorganic filler such as alumina to borosilicate glass or lead borosilicate glass, or may be formed of a sintered body which predominantly contains a dielectric ceramic such as barium titanate, lead titanate, or strontium titanate.

The electricity supply element is a conductor portion which receives electricity from outside, and can be, for example, a metallization layer provided on one plane (a surface opposite a surface for heating a workpiece) of the ceramic substrate.

The electricity supply path is a conductor portion provided in the ceramic substrate for electrically connecting the resistance heat-generating element and the electricity supply element and can be composed of conductive layers, vias, etc.

The via is a conductor portion which extends in the thickness direction of the ceramic substrate and is electrically connected to a conductor portion (s) such as one or both of two conductive layers disposed on the opposite sides in the thickness direction.

The resistance heat-generating element is a well-known heat-generating element which generates heat according to resistance thereof upon energization. The resistance heat-generating element can be formed of a well-known material such as an Ni—Cr alloy, an Fe—Cr—Al alloy, molybdenum (Mo), tungsten (W), platinum (Pt), or molybdenum disilicide.

Well-known materials can be used for conductors used to form the chucking electrode, the radio frequency electrode, the conductive layers, the electricity supply element, and the vias; however, for example, the following materials can be used.

For example, in the case of the ceramic substrate formed of a so-called high-temperature-fired ceramic (e.g., alumina), metal powder contained in the conductors can be of nickel (Ni), tungsten (W), molybdenum (Mo), manganese (Mn), etc., and alloys thereof. In the case of the ceramic substrate formed of a so-called low-temperature-fired ceramic (e.g., glass ceramic), metal powder contained in the conductors can be of copper (Cu), silver (Ag), etc., and alloys thereof. Also, in the case of the ceramic substrate formed of a high-dielectric-constant ceramic (e.g., barium titanate), metal powder contained in the conductors can be of nickel (Ni), copper (Cu), silver (Ag), palladium (Pd), platinum (Pt), etc., and alloys thereof.

The resistance heat-generating element, the chucking electrode, the radio frequency electrode, and the conductive layers can be formed through application of a metal-powder-containing conductor paste by a conventionally known method such as a printing process, followed by firing.

DETAILED DESCRIPTION OF EXEMPLARY EMBODIMENTS OF THE INVENTION

Embodiments of the present invention will next be described with reference to the drawings.

1. First Embodiment

The first embodiment will be described while referring to an electrostatic chuck having a heating member.

1-1. Overall Structure of Electrostatic Chuck

First, the overall structure of the electrostatic chuck will be described.

Figure 1:
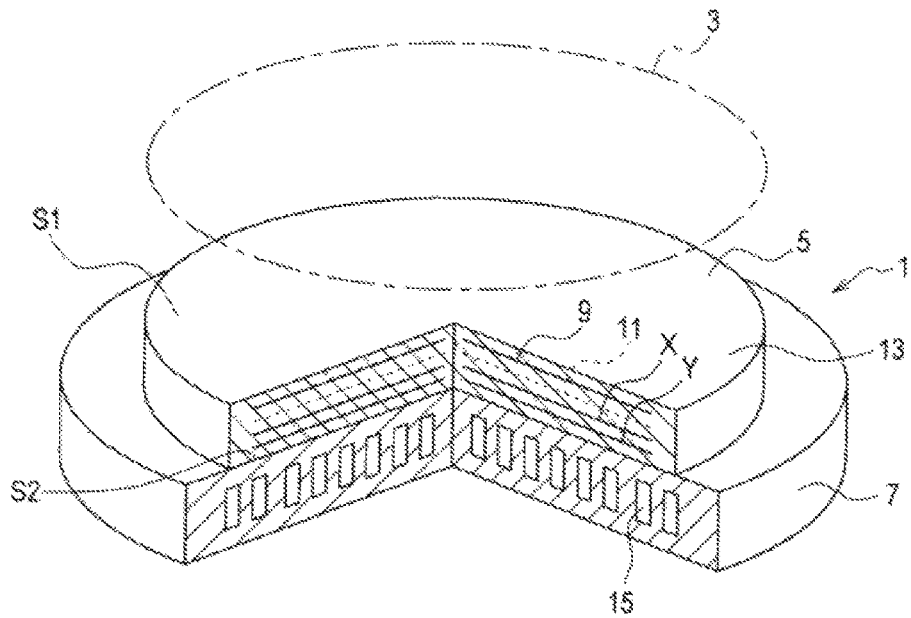
FIG. 1 is a partially cutaway perspective view showing an electrostatic chuck of a first embodiment of the present invention.

As shown in FIG. 1, an electrostatic chuck 1 of the first embodiment is adapted to chuck a workpiece; specifically, a semiconductor wafer 3, on the upper side of FIG. 1. The electrostatic chuck 1 is configured such that a heating member 5 and a metal base (cooling plate) 7 are stacked and bonded together.

The upper surface of the heating member 5 in FIG. 1 is a first main surface (chucking surface) S1, and the lower surface is a second main surface S2.

The heating member 5 is a disk-like member for heating the semiconductor wafer 3. The heating member 5 is composed primarily of a ceramic substrate 13 which internally has a chucking electrode 9, a resistance heat-generating element 11, first conductive layers X, second conductive layers Y, etc., which will be described later.

A metal base 7 has a disk-like shape greater in diameter than the heating member 5 and is coaxially bonded to the heating member 5. The metal base 7 has a cooling path 15 provided therein for flowing cooling fluid in order to cool the heating member 5 (accordingly, the semiconductor wafer 3).

1-2. Structural Elements of Electrostatic Chuck

Next, structural elements of the electrostatic chuck 1 will be described.

Figure 2:
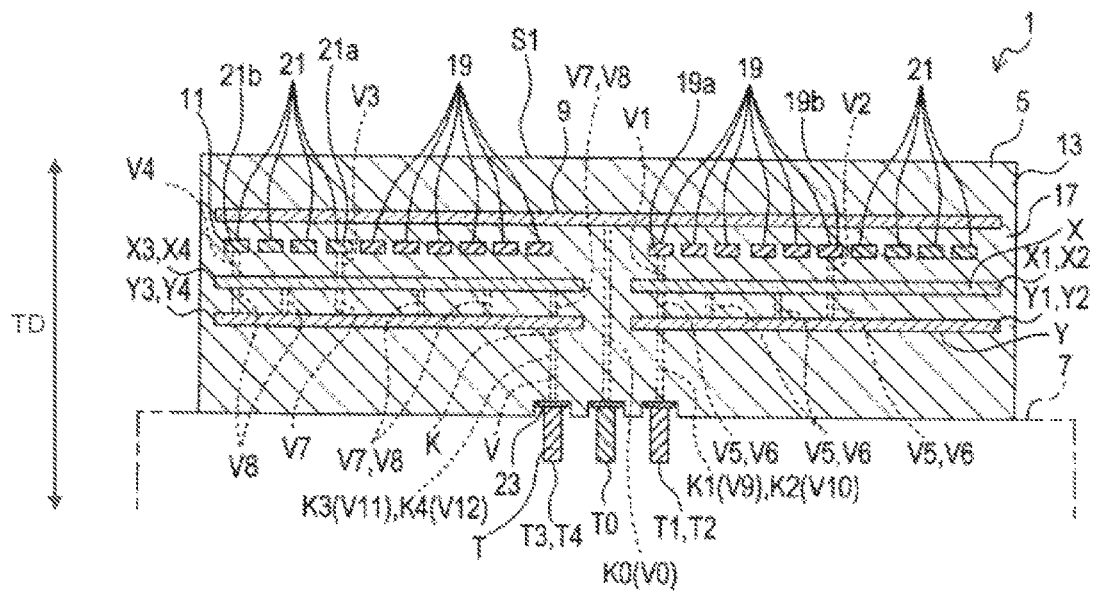
FIG. 2 is a sectional view of the electrostatic chuck of the first embodiment taken along the thickness direction thereof.

As shown in FIG. 2, the ceramic substrate 13 of the heating member 5 is a sintered member formed of, for example, alumina and has a structure in which a plurality of ceramic layers 17 are laminated together in a thickness direction, TD, (vertical direction in FIG. 2). The upper and lower sides appearing in the following description correspond to the upper and lower sides in FIG. 2.

The ceramic substrate 13 internally has, from the upper side in FIG. 2, the chucking electrode 9, the resistance heat-generating element 11 composed of an inner heater 19 and an outer heater 21, the first conductive layers X (X1, X2, X3, and X4), and the second conductive layers Y (Y1, Y2, Y3, and Y4) disposed at different positions in the thickness direction. The chucking electrode 9, the resistance heat-generating element 11, the first conductive layers X, and the second conductive layers Y extend in the planar direction (directions perpendicular to the vertical direction of FIG. 2) of the ceramic layers 17.

Electricity supply elements 23 are formed at a portion of the lower surface of the ceramic substrate 13 for respective terminals T (T0, T1, T2, T3, and T4). The electricity supply elements 23 are metallization layers to which the respective terminals T are attached.

Also, the ceramic substrate 13 internally has a plurality of vias V formed along the thickness direction for electrically connecting electrically conductive layers such as the chucking electrode 9, the resistance heat-generating element 11, the first conductive layers X, the second conductive layers Y, the electricity supply elements 23, etc., by predetermined electricity supply paths K (K0, K1, K2, K3, and K4).

Chucking Electrode

The chucking electrode 9 is, for example, a disk-like metallization layer formed of W or Mo. The chucking electrode 9 is provided in the heating member 5 at a position located toward the chucking surface S1, in parallel with the chucking surface S1. The chucking electrode 9 is electrically connected to the terminal T0 through the via (through via) V0, which serves as the electricity supply path K0.

Resistance Heat-Generating Element

Figure 3:
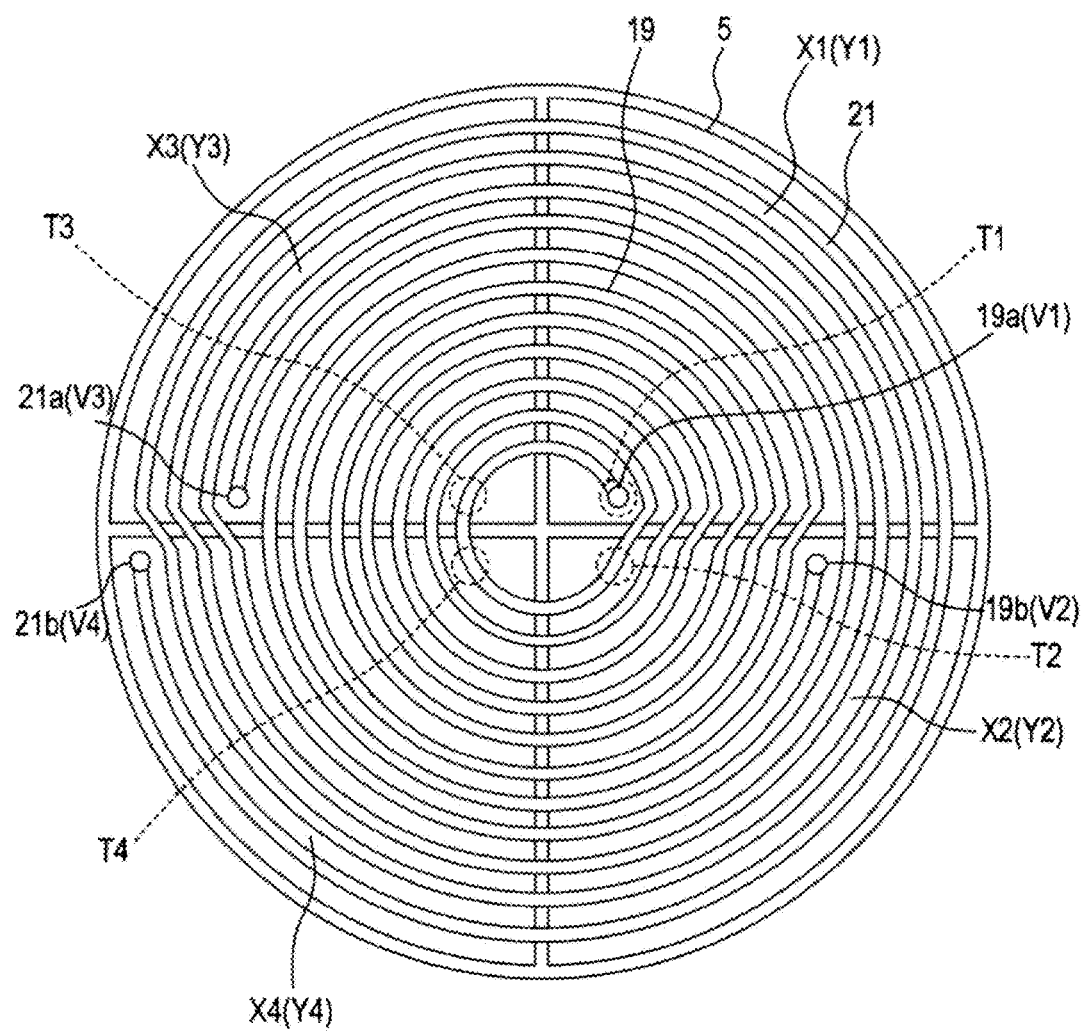
FIG. 3 is a top view showing the structure of a heating member of the electrostatic chuck of the first embodiment.

The inner heater 19 which partially constitutes the resistance heat-generating element 11 is a metallization layer formed of W or Mo and is a spiral heater located under the chucking electrode 9. Specifically, as shown in FIG. 3, as viewed from above (as viewed from the thickness direction of the electrostatic chuck 1, or in plan view), the center of the inner heater 19 coincides with the center of the heating member 5. The inner heater 19 extends from the center of the heating member 5 to a mid position (i.e., a radially intermediate position) between the center and the outer circumference (outer edge) of the heating member 5.

An end portion 19a of the inner heater 19 on the inner circumferential side is located above the first conductive layer X1, and an end portion 19b of the inner heater 19 on the outer circumferential side is located above the first conductive layer X2.

The outer heater 21 is a metallization layer formed of W or Mo and is a spiral heater located externally of the inner heater 19 on the same plane as is the inner heater 19. As shown in FIG. 3, as viewed from above, the center of the outer heater 21 coincides with the center of the heat generating member 5, and the outer heater 21 extends between the outermost circumference of the inner heater 19 and the outer circumference of the heating member 5.

An end portion 21a of the outer heater 21 on the inner circumferential side is located above the first conductive layer X3, and an end portion 21b of the outer heater 21 on the outer circumferential side is located above the first conductive layer X4.

First Conductive Layers

As shown in FIG. 2, the first conductive layers X1, X2, X3, and X4 are metallization layers formed of W or Mo and located under and adjacent to the inner heater 19 and the outer heater 21.

Figure 4A:
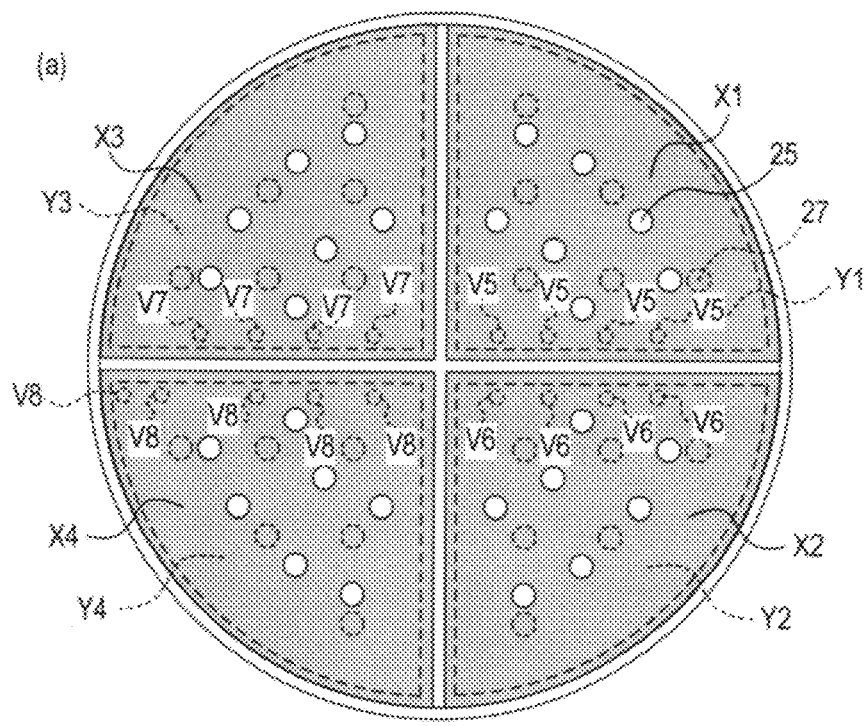
FIG. 4A is a plan view showing a first conductive layer of the first embodiment.

Also, as shown in FIG. 4A, each of the first conductive layers X1, X2, X3, and X4 has the shape of a quarter of a circle (quadrant, or a fan shape); i.e., the first conductive layers X1, X2, X3, and X4 have shapes corresponding to four equal parts of a circle which are obtained by dividing the circle by two lines passing through the center of the circle and which have the same central angle (see the gray portions in FIG. 4A).

The first conductor layers X1, X2, X3, and X4 are separated from one another with a predetermined gap formed therebetween so as to avoid mutual contact. Accordingly, the gap region has a cross shape in plan view.

Further, each of the first conductive layers X1, X2, X3, and X4 has a plurality of (e.g., seven) through holes 25 extending therethrough in the thickness direction (vertical direction in FIG. 2). The through holes 25 are disposed substantially in a uniformly dispersed manner over the entire surface of each of the first conductive layers X1, X2, X3, and X4.

Also, as shown in FIGS. 2 and 3, the first conductive layer X1 and the end portion 19a of the inner heater 19 are connected by a via V1. The first conductive layer X2 and the end portion 19b of the inner heater 19 are connected by a via V2. The first conductive layer X3 and the end portion 21a of the outer heater 21 are connected by a via V3. The first conductive layer X4 and the end portion 21b of the outer heater 21 are connected by a via V4.

The vias V are formed by filling a metallization material which contains W or Mo as a main component into through holes formed in the ceramic layers 17.

Second Conductive Layer

The second conductive layers Y1, Y2, Y3, and Y4 are metallization layers formed of W or Mo and located under and adjacent to the first conductive layers X1, X2, X3, and X4, respectively.

Figure 4B:
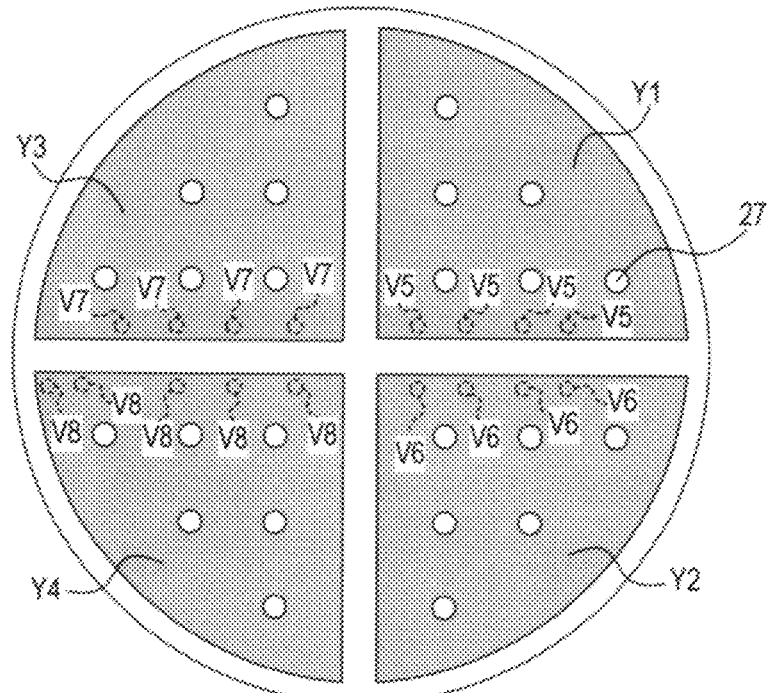
FIG. 4B is a plan view showing a second conductive layer of the first embodiment.

Also, as shown in FIG. 4B, the second conductive layers Y1, Y2, Y3, and Y4 are similar in shape to and smaller in size than the first conductive layers X1, X2, X3, and X4, respectively (quadrant, or a fan shape).

The second conductor layers Y1, Y2, Y3, and Y4 are separated from one another with a predetermined gap formed therebetween so as to avoid mutual contact. Accordingly, the gap region has a cross shape in plan view.

The second conductive layer Y1 is located under the first conductive layer X1; the second conductive layer Y2 is located under the first conductive layer X2; the second conductive layer Y3 is located under the first conductive layer X3; and the second conductive layer Y4 is located under the first conductive layer X4.

Figure 5:
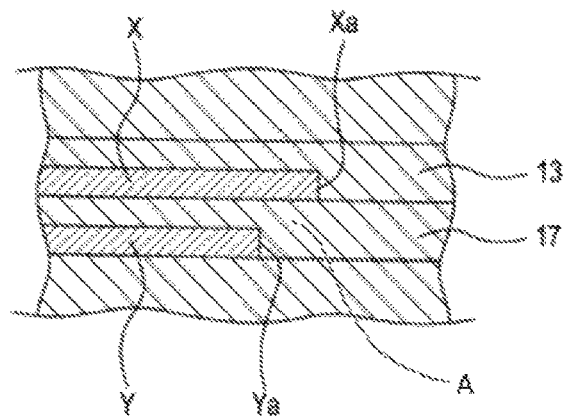
FIG. 5 is a sectional view showing partially, on an enlarged scale, outer edges of the first and second conductive layers shown in FIG. 2, and their periphery.

Further, as shown in FIG. 4A, regions demarcated in plan view by outer edges Xa (see FIG. 5) of the upper first conductive layers X1, X2, X3, and X4 encompass the lower second conductive layers Y1, Y2, Y3, and Y4, respectively.

Accordingly, the outer edges Xa of the upper first conductive layers X1, X2, X3, and X4 are positionally offset from outer edges Ya (see FIG. 5) of the lower second conductive layers Y1, Y2, Y3, and Y4, respectively. That is, the outer edges Xa of all of the first conductive layers X are positionally offset from the outer edges Ya of all of the second conductive layers Y. Also, the upper first conductive layers X1, X2, X3, and X4 are greater in area than the lower second conductive layers Y1, Y2, Y3, and Y4, respectively.

Further, as shown in FIG. 4B, each of the second conductive layers Y1, Y2, Y3, and Y4 has a plurality of (e.g., six) through holes 27 extending therethrough in the thickness direction (vertical direction in FIG. 2). The through holes 27 are disposed substantially in a uniformly dispersed manner over the entire surface of each of the second conductive layers Y1, Y2, Y3, and Y4.

Moreover, as shown in FIG. 4A, all of the through holes 25 of the first conductive layers X are positionally offset from all of the through holes 27 of the second conductive layers Y in such a manner as not to overlap one another in plan view.

Figure 6:
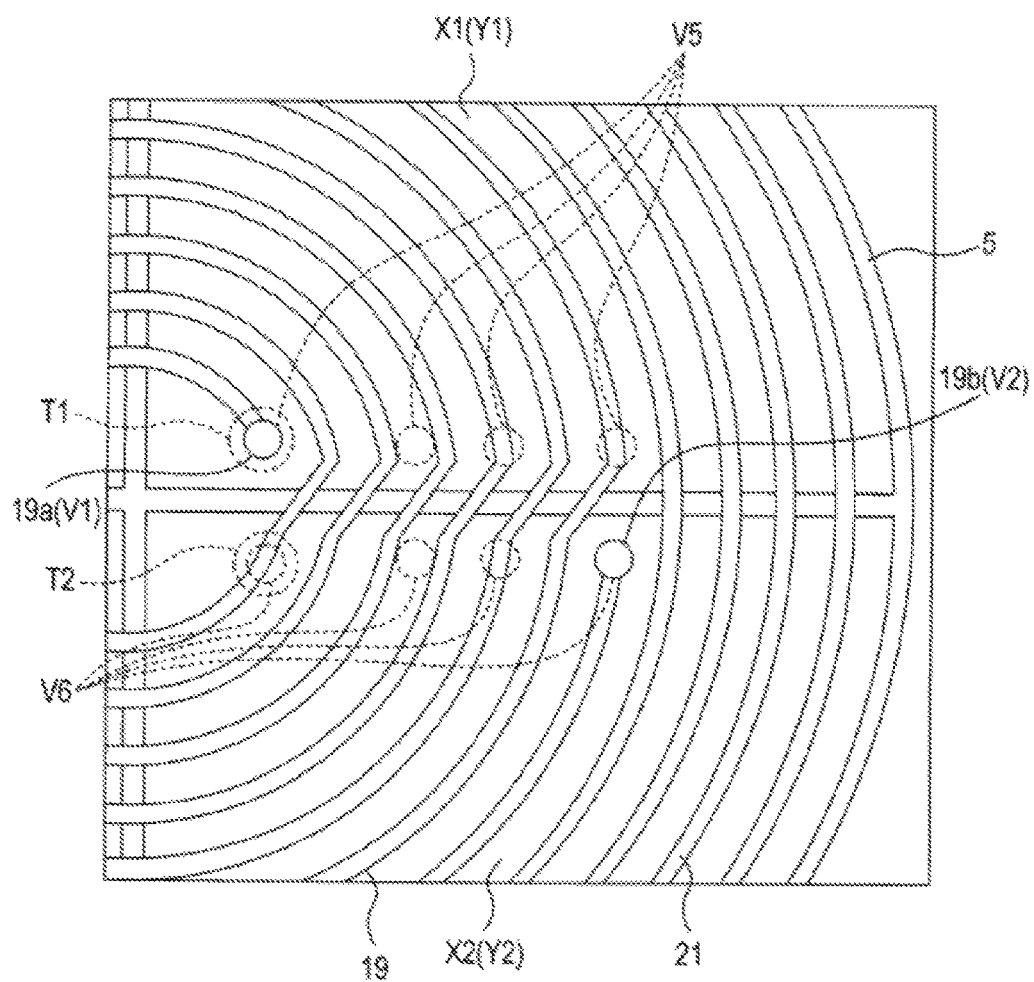
FIG. 6 is a top view showing partially the structure of the heating member of the electrostatic chuck.

Also, as shown in FIGS. 2, 4, and 6, the first conductive layer X1 and the second conductive layer Y1 are connected by a plurality of vias V5.

Similarly, the first conductive layer X2 and the second conductive layer Y2 are connected by a plurality of vias V6.

Similarly, the first conductive layer X3 and the second conductive layer Y3 are connected by a plurality of vias V7.

Similarly, the first conductive layer X4 and the second conductive layer Y4 are connected by a plurality of vias V8.

Terminals

As shown in FIG. 2, the terminals T are rodlike terminals formed of an electrically conductive material, provided on the lower side of the heating member 5, and bonded to the respective electricity supply elements 23.

Of the terminals T, a terminal T0 is disposed at the center among other terminals T1, T2, T3, and T4 (i.e., at the center of the heating member 5) in plan view and is connected to the chucking electrode 9 by the electricity supply path K0.

The other terminals T1, T2, T3, and T4 are disposed under the second conductive layers Y1, Y2, Y3, and Y4, respectively, in plan view (see FIGS. 2 and 3). Specifically, the terminal T1 is connected to the second conductive layer Y1 by the electricity supply path K1 which includes a via V9; the terminal T2 is connected to the second conductive layer Y2 by the electricity supply path K2 which includes a via V10; the terminal T3 is connected to the second conductive layer Y3 by the electricity supply path K3 which includes a via V11; and the terminal T4 is connected to the second conductive layer Y4 by the electricity supply path K4 which includes a via V12.

The electricity supply paths K (K0 to K4) are well-known electrical paths composed of the vias V (V0 to V12) and the conductive layers X and Y.

In the electrostatic chuck 1 having the above structure, the following current path is formed with respect to the inner heater 19: terminal T1→via V9→second conductive layer Y1→via V5→first conductive layer X1→via V1→inner heater 19→via V2→first conductive layer X2→via V6→second conductive layer Y2→via V10→terminal T2. Also, the following current path is formed with respect to the outer heater 21: terminal T3→via V11→second conductive layer Y3→via V7→first conductive layer X3→via V3→outer heater 21→via V4→first conductive layer X4→via V8→second conductive layer Y4→via V12→terminal T4. That is, the resistance heat-generating element 11 is composed of a plurality of heat-generating sections which can be controlled independent of one another.

1-3. Method of Manufacturing Electrostatic Chuck

Next, a method of manufacturing the electrostatic chuck 1 will be described.

The electrostatic chuck 1 can be manufactured by the following steps (i) to (ix).

(i) Green sheets (green sheets used to form the ceramic layers 17) having a well-known composition are prepared by use of ceramic, sintering aid, organic binder, etc., as materials.

(ii) The green sheets are cut into a predetermined size.

(iii) Through holes are formed in the green sheets at positions at which the vias V are to be formed later.

(iv) A metallization material which contains W or Mo as a main component is filled into the through holes.

(v) A metallization material which contains W or Mo as a main component is applied onto the green sheets by use of a screen printing process to form layers which are to become the chucking electrode 9, the inner heater 19, the outer heater 21, and the first and second conductive layers X and Y.

(vi) Holes for attachment of the terminals T, etc., are formed in the relevant green sheet by drilling. The outer diameters of the green sheets are adjusted according to the shape of the heating member 5.

(vii) The green sheets are laminated and compressed together to form a laminate. Paste which is to become the electricity supply elements 23 is applied to a portion of the surface of the laminate (at the positions of attachment of the terminals T).

(viii) The yielded laminate is fired; then, the terminals T are attached to the fired laminate to form the heating member 5.

(ix) Subsequently, the metal base 7 is bonded to the heating member 5 to complete the electrostatic chuck 1.

1-4. Action and Effect of Electrostatic Chuck

Next, the working effects of the electrostatic chuck 1 will be described.

In the electrostatic chuck 1 of the first embodiment, since the outer edges Xa and Ya of the first and second conductive layers X and Y are positionally offset from each other in plan view, a large step is unlikely to arise; thus, separation of the ceramic layers 17, etc., is unlikely to arise. That is, since the first conductive layer X and the second conductive layer Y do not overlie each other in a region where the outer edges Xa and Ya are offset from each other, a step which arises as a result of existence of the conductive layers X and Y can be reduced in magnitude. Therefore, there can be restrained the occurrence of separation between the ceramic layers 17 and between the ceramic layers 17 and the conductive layers X and Y, which could otherwise be likely to result from formation of a step.

In the first embodiment, since a region, A,(labeled in FIG. 5) demarcated by the outer edge Xa of the first conductive layer X encompasses the second conductive layer Y, the vias V can be readily provided in a wide planar region of the second conductive layer Y. That is, since the positional limitations of the vias V are few, the degree of freedom of design is improved.

In the first embodiment, since the first conductive layer X located toward the first main surface S1 (toward the resistance heat-generating element 11) is greater in area than the second conductive layer Y located toward the second main surface S2, on the surface of the ceramic substrate 13 located toward the first main surface S1, temperature distribution can be two-dimensionally uniform.

In the first embodiment, since the first and second conductive layers X and Y have the through holes 25 and 27 formed respectively therein, the bonding performance between the ceramic layers 17 between which the first and second conductive layers X and Y are individually sandwiched is enhanced. Moreover, since the through holes 25 formed in the first conductive layer X are positionally offset from the through holes 27 formed in the second conductive layer Y, the bonding performance between the ceramic layers 17 is further enhanced.

1-5. Modifications

In the electrostatic chuck 1 of the first embodiment, the metal base 7 has a disk-like shape greater in diameter than the heating member 5. However, no particular limitation is imposed on the shape and size of the metal base 7. For example, the metal base 7 may have the same diameter as that of the heating member 5.

Also, in the electrostatic chuck 1, the metal base 7 can be eliminated.

The outer edges Xa of the first conductive layers X may be partially offset in position from the outer edges Ya of the corresponding second conductive layers Y rather than entirely offset in position from the outer edges Ya.

The relation between the first conductive layers X and the second conductive layers Y indicates the relation between the first conductive layers X1 to X4 and the second conductive layers Y1 to Y4, respectively, which are disposed in a mutually facing manner (the same also applies to the following description).

The through holes 25 of the first conductive layer X and the through holes 27 of the second conductive layer Y may be disposed such that the through holes 25 of the first conductive layer X partially overlap with the through holes 27 of the second conductive layer Y.

The mutually facing first and second conductive layers X and Y may not have a similar shape.

The outer edges Xa of the first conductive layers X may be located internally of the outer edges Ya of the corresponding second conductive layers Y which face the first conductive layers X. That is, the first conductive layers X may be smaller in area than the second conductive layers Y.

The resistance heat-generating element 11 may be divided into three or more pieces. In response to such division, the first conductive layers X and the second conductive layers Y may individually be divided into four or more pieces.

The chucking electrode 9 may employ the structure of another well-known chucking electrode. For example, a plurality of chucking electrodes may be used.

The terminal T0 can be provided at any position other than the center of the heating member 5.

2. Second Embodiment

Next, a second embodiment of the present invention will be described; however, a repeated description of structural elements similar to those of the first embodiment is omitted.

Structural elements similar to those of the first embodiment are denoted by the same reference numerals.

Figure 7:
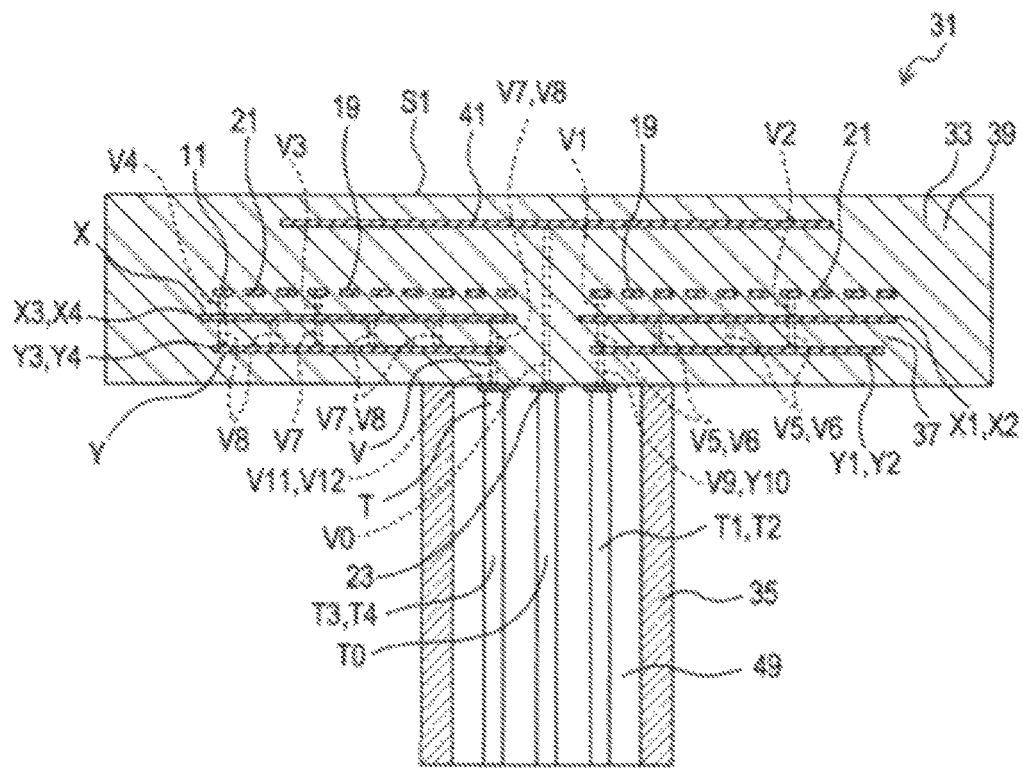
FIG. 7 is a sectional view of a ceramic heater of a second embodiment of the present invention taken along the thickness direction thereof.

As shown in FIG. 7, a ceramic heater 31 of the second embodiment is a device for use in a semiconductor fabrication system.

Specifically, the ceramic heater 31 is disposed in, for example, a chamber (not shown) which accommodates the semiconductor wafer 3 for processing the semiconductor wafer 3 by plasma, and is adapted to heat the semiconductor wafer 3 placed (mounted) thereon.

The ceramic heater 31 includes a disk-like heating member 33 and a cylindrical support member 35. The support member 35 is coaxially bonded to the heating member 33 at the back side (lower side in FIG. 7).

The heating member 33 and the support member 35 are formed of sintered aluminum nitride which contains aluminum nitride as a main component. The structural elements are described below. In the following description, the upper side corresponds to the upper side in FIG. 7, and the lower side corresponds to the lower side in FIG. 7.

Heating Member

The heating member 33 includes a ceramic substrate 39 in which mainly a plurality of ceramic layers (not shown) are laminated together.

In the ceramic substrate 39, a disk-like radio frequency electrode (a known RF electrode) 41 to which radio frequency voltage is applied is disposed toward the upper side (toward the first main surface S1). The radio frequency electrode 41 is electrically connected to the terminal T (T0) through the via V (V0) and the electricity supply element 23.

Also, under the radio frequency electrode 41, structural elements for heating similar to those of the first embodiment are disposed; specifically, the resistance heat-generating element 11 composed of the inner heater 19 and the outer heater 21, the first conductive layers X (X1, X2, X3, and X4), the second conductive layers Y (Y1, Y2, Y3, and Y4), and the electricity supply elements 23 are disposed sequentially from the upper side. Further, similarly to the first embodiment, the terminals T (T1, T2, T3, and T4) corresponding to the second conductive layers Y1, Y2, Y3, and Y4 are attached to the respective electricity supply elements 23.

The above-mentioned resistance heat-generating element 11, the first conductive layers X, the second conductive layers Y, and the electricity supply elements 23 are similar in shape and disposition in plan view to the first embodiment. Specifically, the first conductive layers X and the second conductive layers Y have a similar shape, and the outer edges of the first conductive layers X are positionally offset from the outer edges of the corresponding second conductive layers Y. Also, the first conductive layers X and the second conductive layers Y have through holes (not shown) formed therein, and the through holes are positionally offset from one another.

Also, similarly to the first embodiment, the ceramic substrate 39 internally has, in a vertically disposed manner, the vias V1, V2, V3, and V4 which connect the resistance heat-generating element 11 and the first conductive layers X, the vias V5, V6, V7, and V8 which connect the first conductive layers X and the second conductive layers Y, and the vias V9, V10, V11, and V12 which connect the second conductive layers Y and the electricity supply elements 23.

Support Member

As mentioned above, the support member 35 is a cylindrical member coaxially bonded to the lower surface of the heating member 33. The heating member 33 and the support member 35 are bonded by, for example, diffusion bonding; however, another method such as brazing may be employed for bonding.

Connection members (not shown) are disposed in a center hole 49 of the support member 35 for connecting the terminals T to external equipment.

As usual in the prior art, the ceramic heater 31 of the second embodiment can perform plasma processing and the like by applying radio frequency (alternating current) voltage between the radio frequency electrode 41 and a counter electrode (a counter electrode disposed externally of the ceramic heater 31, not shown) which faces the radio frequency electrode 41. By virtue of the structural features of the first conductive layers X, the second conductive layers Y, etc., similar to the structural features of the first embodiment, the second embodiment yields effects similar to those yielded by the first embodiment.

3. Third Embodiment

Next, a third embodiment of the present invention will be described; however, a repeated description of structural elements similar to those of the first embodiment is omitted.

Structural elements similar to those of the first embodiment are denoted by the same reference numerals.

Figure 8:
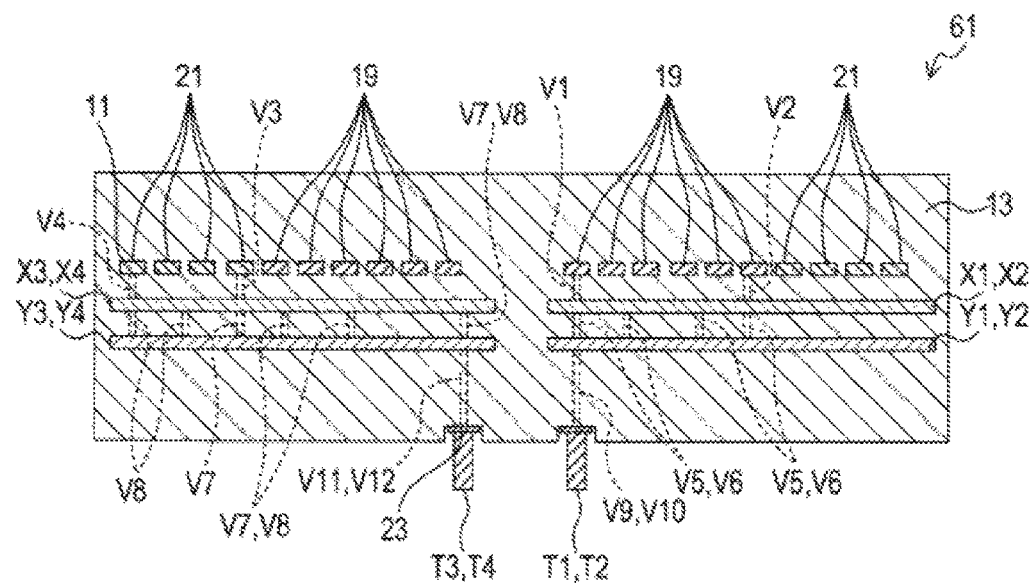
FIG. 8 is a sectional view of a heating member of a third embodiment of the present invention taken along the thickness direction thereof.

As shown in FIG. 8, a heating member 61 of the third embodiment is a heating device for use in, for example, a semiconductor fabrication system.

The basic structure of the heating member 61 is such that the chucking electrode and structural elements for supplying electricity to the chucking electrode are eliminated from the heating member of the first embodiment.

Specifically, similarly to the first embodiment, the heating member 61 is such that the ceramic substrate 13 internally has the resistance heat-generating element 11 composed of the inner heater 19 and the outer heater 21, the first conductive layers X1, X2, X3, and X4, the second conductive layers Y1, Y2, Y3, and Y4, the electricity supply elements 23, and the vias V1, V2, V3, V4, V5, V6, V7, V8, V9, V10, V11, and V12 for connecting them to one another. The heating member 61 also has the terminals T1, T2, T3, and T4.

The heating member 61 of the third embodiment yields effects similar to those yielded by the first embodiment.

The present invention is not limited to the above embodiments, but may be embodied in various other forms without departing from the gist of the invention.

For example, in the first to third embodiments, the first conductive layers X1, X2, X3, and X4 have shapes corresponding to four equal parts of a circle which are obtained by dividing the circle by two lines passing through the center of the circle and which have the same central angle. However, the first conductive layers X1, X2, X3, and X4 can have any shapes. For example, the first conductive layers X1, X2, X3, and X4 may have mutually different shapes.

DESCRIPTION OF REFERENCE NUMERALS

1: electrostatic chuck
5, 33, 61: heating member
11: resistance heat-generating element
13, 39: ceramic substrate
17: ceramic layer
23: electricity supply element
25, 27: through hole
31: ceramic heater
41: radio frequency electrode
K, K0, K1, K2, K3, K4: electricity supply path
T, T0, T1, T2, T3, T4: terminal
V, V0, V1, V2, V3, V4, V5, V6, V7, V8, V9, V10, V11, V12: via
X, X1, X2, X3, X4: first conductive layer
Y, Y1, Y2, Y3, Y4: second conductive layer
Xa, Ya: outer edge

What is claimed is:

1. A heating member comprising:
   a ceramic substrate having a structure in which a plurality of ceramic layers are laminated together;
   a resistance heat-generating element embedded in the ceramic substrate;
   an electricity supply element disposed on a surface of the ceramic substrate; and
   an electricity supply path embedded in the ceramic substrate and electrically connecting the resistance heat-generating element and the electricity supply element, the electricity supply path including a plurality of conductive layers disposed along a planar direction of the ceramic layers at different positions in a thickness direction of the ceramic substrate, and a plurality of vias disposed along the thickness direction of the ceramic substrate wherein, when the plurality of conductive layers are viewed from the thickness direction, an outer edge of one of the plurality of conductive layers is positionally offset from an outer edge of at least one other of the plurality of conductive layers, wherein at least two of the plurality of conductive layers each have one or more through holes extending therethrough in the thickness direction, and wherein, when the at least two of the plurality of conductive layers having the through holes formed therein are viewed from the thickness direction, the through holes of a first of the two of the plurality of conductive layers are positionally offset from the through holes of a second of the two of the plurality of conductive layers.

2. The heating member according to claim 1, wherein, when viewed from the thickness direction, a region demarcated by the outer edge of the one of the plurality of conductive layers encompasses the at least one other of the plurality of conductive layers.

3. The heating member according to claim 1, wherein the one of the plurality of conductive layers is located nearer to the resistance heat-generating element and is greater in area than the at least one other of the plurality of conductive layers which is located nearer to the electricity supply element.

4. An electrostatic chuck comprising:
a heating member including:
a ceramic substrate having a structure in which a plurality of ceramic layers are laminated together,
a resistance heat-generating element embedded in the ceramic substrate,
an electricity supply element disposed on a surface of the ceramic substrate, and
an electricity supply path embedded in the ceramic substrate and electrically connecting the resistance heat-generating element and the electricity supply element, the electricity supply path including a plurality of conductive layers disposed along a planar direction of the ceramic layers at different positions in a thickness direction of the ceramic substrate, and a plurality of vias disposed along the thickness direction of the ceramic substrate; and
a chucking electrode embedded in the ceramic substrate;
wherein, when the plurality of conductive layers of the heating member are viewed from the thickness direction, an outer edge of one of the plurality of conductive layers is positionally offset from an outer edge of at least one other of the plurality of conductive layers,
wherein at least two of the plurality of conductive layers each have one or more through holes extending therethrough in the thickness direction, and
wherein, when the at least two of the plurality of conductive layers having the through holes formed therein are viewed from the thickness direction, the through holes of a first of the two of the plurality of conductive layers are positionally offset from the through holes of a second of the two of the plurality of conductive layers.

5. The electrostatic chuck according to claim 4, wherein, when viewed from the thickness direction, a region demarcated by the outer edge of the one of the plurality of conductive layers encompasses the at least one other of the plurality of conductive layers.

6. The electrostatic chuck according to claim 4, wherein the one of the plurality of conductive layers is located nearer to the resistance heat-generating element and is greater in area than the at least one other of the plurality of conductive layers which is located nearer to the electricity supply element.

7. A ceramic heater comprising:
a heating member including:
a ceramic substrate having a structure in which a plurality of ceramic layers are laminated together,
a resistance heat-generating element embedded in the ceramic substrate,
an electricity supply element disposed on a surface of the ceramic substrate, and
an electricity supply path embedded in the ceramic substrate and electrically connecting the resistance heat-generating element and the electricity supply element, the electricity supply path including a plurality of conductive layers disposed along a planar direction of the ceramic layers at different positions in a thickness direction of the ceramic substrate, and a plurality of vias disposed along the thickness direction of the ceramic substrate; and
a radio frequency electrode embedded in the ceramic substrate;
wherein, when the plurality of conductive layers of the heating member are viewed from the thickness direction, an outer edge of one of the plurality of conductive layers is positionally offset from an outer edge of at least one other of the plurality of conductive layers,
wherein at least two of the plurality of conductive layers each have one or more through holes extending therethrough in the thickness direction, and
wherein, when the at least two of the plurality of conductive layers having the through holes formed therein are viewed from the thickness direction, the through holes of a first of the two of the plurality of conductive layers are positionally offset from the through holes of a second of the two of the plurality of conductive layers.

8. The ceramic heater according to claim 7, wherein, when viewed from the thickness direction, a region demarcated by the outer edge of the one of the plurality of conductive layers encompasses the at least one other of the plurality of conductive layers.

9. The ceramic heater according to claim 7, wherein the one of the plurality of conductive layers is located nearer to the resistance heat-generating element and is greater in area than the at least one other of the plurality of conductive layers which is located nearer to the electricity supply element.

* * * * *